US006606261B2

(12) United States Patent
Gudesen et al.

(10) Patent No.: US 6,606,261 B2
(45) Date of Patent: Aug. 12, 2003

(54) METHOD FOR PERFORMING WRITE AND READ OPERATIONS IN A PASSIVE MATRIX MEMORY, AND APPARATUS FOR PERFORMING THE METHOD

(75) Inventors: Hans Gude Gudesen, Brussels (BE); Per-Erik Nordal, Asker (NO); Per Bröms, Linköping (SE); Mats Johansson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/899,094

(22) Filed: Jul. 6, 2001

(65) Prior Publication Data

US 2002/0027794 A1 Mar. 7, 2002

(30) Foreign Application Priority Data

Jul. 7, 2000 (NO) .......................................... 20003507

(51) Int. Cl.$^7$ ............................ G11C 11/12; G11C 13/04
(52) U.S. Cl. ..................... 365/145; 365/117; 365/121
(58) Field of Search ........................ 365/117, 145, 365/121, 147, 210, 65, 189.04

(56) References Cited

U.S. PATENT DOCUMENTS 5,206,829 A * 4/1993 Thakoor et al. ............ 365/117
5,487,029 A    1/1996 Kuroda ...................... 365/145
5,726,930 A * 3/1998 Hasegawa et al. .......... 365/145
5,751,625 A * 5/1998 Mihara ....................... 365/145
5,898,607 A * 4/1999 Saito et al. ................. 365/106

FOREIGN PATENT DOCUMENTS

EP    0767464 A2    4/1997
EP    1001429 A1    5/2000

* cited by examiner

*Primary Examiner*—Thong Le
(74) *Attorney, Agent, or Firm*—Birch, Stewart, Kolasch & Birch, LLP (57) ABSTRACT

A method and apparatus for performing read and write operations in matrix-addressed memory array of memory cells is described. The memory cells comprising an electrically polarizable material exhibiting polarization remanence, in particular and electret or ferroelectric material, where a logical value stored in a memory cell is represented by an actual polarization state in the memory cell. The degree of polarization in the polarizable material is limited during each read and write cycle to a value defined by a circuit device controlling the read and write operations, with said value ranging from zero to an upper limit corresponding to saturation of the polarization and consistent with predetermined criterta for a reliable detection of a logic state of a memory cell.

23 Claims, 4 Drawing Sheets

Figure 1a

General polarization curve with definitions of "1" and "0" state

Switch and Non-Switch Charge Curves vs. Time

Figure 2b

Same curve as above but higher time resolution.

Figure 3

Block schematics of possible circuit design

METHOD FOR PERFORMING WRITE AND READ OPERATIONS IN A PASSIVE MATRIX MEMORY, AND APPARATUS FOR PERFORMING THE METHOD

CROSS-REFERENCE TO RELATED APPLICATIONS

This application claims priority under 35 U.S.C. §119 of Application No. 20003507 (Norway) filed Jul. 7, 2000.

BACKGROUND OF THE INVENTION

1. Field of the Invention

The present invention concerns a method for performing write and read operations. More particularly, the present invention relates to a method for performing read and write operations in a matrix-addressed memory array of memory cells comprising an electrically polarizable material exhibiting polarization remanence, in particular an electret or ferroelectric material, wherein a logical value stored in a memory cell is represented by an actual polarization state in the memory cell and is determined by detecting a charge flow to or from the cell in response to the application of voltages to the word and bit lines for addressing the memory cells of the array, wherein the charge flow detection in particular is based on detecting a charge flow component caused by a change of polarization in the polarizable material, and wherein write and read operations are performed under control of a control circuit device. The present invention also concerns an apparatus for performing the method; the apparatus including at least one matrix-addressed memory array of memory cells comprising an electrically polarizable material exhibiting polarization remanence, in particular a ferroelectric material, wherein logical value stored in a memory cell is represented by the polarization state in individual, separately selectable memory cells and determined by detecting a charge flow to or from the memory cells in response to an application of voltages to the word and bit lines for addressing the memory cells of an array, the charge flow detection in particular being based on a charge flow component caused by a change of polarization in said polarizable material.

2. Description of Related Art

Memory devices based on ferroelectric thin films are presently approaching a level of maturity where implementation in practical devices becomes possible. Two main types of device architectures are of relevance, involving either active or passive matrix addressing of the stored data.

In active matrix addressed architectures, each bit is stored in a memory cell consisting of a ferroelectric-filled capacitor structure with an associated dedicated microcircuit. The ferroelectric material is typically polarized in one of two stable states, representing a bit of information. The memory device comprises a large number of such cells, arranged in a matrix of conductors. Typically, the ferroelectric materials used in such devices are inorganic ceramics, e.g. perovskites.

In passive matrix addressed architectures, which are the ones of primary relevance in the present invention, the thin-film ferroelectric material is sandwiched between two orthogonal sets of electrodes such that a capacitor-like structure is formed in each overlap region between crossing electrodes. A bit is stored as a polarization state in the capacitor structure, which constitutes an elementary memory cell. No active circuitry is involved in connection with each cell, hence the term passive matrix addressing. This architecture is generally dependent on ferroelectrics with particular hysteresis properties, and at present only a few, organic based ferroelectrics have been identified as potentially useful in practice. The information is typically read destructively, i.e. by imposing an electric field that causes polarization alignment in the memory cells along the reading field direction.

In many applications, it is desirable to perform read/write operations in a given memory cell a large number of times, in which case the polarizable material is forced to undergo repeated polarization reversals and ultimately becomes fatigued. Fatigue manifests itself in different ways, most prominently as increased coercive field, lower remanent polarization and slower switching, all of which are highly undesirable in memory devices. Another phenomenon which complicates the readout process is imprint. When a cell is left in the same polarization state (i.e. logic state) for an extended time period, it may develop a tendency to be "frozen" into that state, such that the driving voltage must be increased and/or applied for a longer time in order to dislodge it and switch it to the other polarization direction.

Prior art reading protocols that employ read pulses of fixed length must take into account the large spread in cell switching speeds and polarization response that develops due to fatigue and/or imprint. Thus the pulses must have a high voltage and a long duration to be sure that the worst-case scenario could be handled. This is undesirable for several reasons. A high voltage implies higher cost and more space-demanding driving circuitry, more power consumption and increased cross-talk. Longer pulses imply lower data access and transfer speeds. Finally, employing long pulses at high voltage even to cells that are pristine or only moderately fatigued shall by itself contribute to accelerated fatigue.

Concrete examples of background art concerning methods for readout of data from a ferroelectric memory device, reference can be made to EP patent application No. 0 767 464 A2 (Tamura et al.) which in order to minimize disturbance of the logic state of a ferroelectric memory cell, applies a pulse voltage protocol which avoids large voltage excursions across the memory cell and the readout voltage protocol is moreover static with respect to temporal as well as amplitude aspects of the voltage pulses to be applied. Reference can further be made to U.S. Pat. No. 5,487,029 (Kuroda) which discloses the use of a refreshing procedure after a certain number of read/write operations applied to a memory cell has been executed, the refreshing procedure consisting of applying a polarization voltage $V_p$ higher than the write voltage $V_0$. This ensures to remove a fatigue-induced reduction in the ferroelectric polarization and restore a higher polarization value of the memory cell. However, such a refreshing procedure will at best only be applicable in special instances, e.g. in the case where fatigue are due to charge accumulation and domain pinning because of shallow charge traps, but would be of little help in more complicated cases where deep charge traps, vacancy migration or when an irreversible chemistry at the electrodes are involved. It should moreover be noted that both the above-mentioned publications relate to active matrix-addressable memory devices only, whereas it would be desirable that the write/read protocols should be applicable to passive matrix-addressable memory devices as well.

BRIEF SUMMARY OF THE INVENTION

The present invention provides new methods for reading and writing data in memory devices based on electrically polarizable material, in particular ferroelectrics, whereby the polarization can be probed and controlled by methods that are less prone to create fatigue, yield faster data speeds and are less demanding of the driving circuitry than present-day alternatives.

The features of the present invention can be achieved with a method, which according to the invention, is characterized by recording a dynamic charge response of one or more of the memory cells during a write and read operation, by limiting a degree of polarization in the polarizable material during each write and read cycle to a value dependent on the recorded dynamic charge response and as defined by the control circuit device, and controlling the write and read operations according to an actual instantaneous charge response information with the value ranging from zero to an upper limit corresponding to the saturation magnitude of the polarization and being consistent with predetermined criteria for a reliable detection of a logic state of a memory cell.

In an embodiment of a method according to the invention, the stored logical value of a memory cell is determined by an application of one or more voltage pulses, the characteristics of which is controlled by the control circuit device.

In an embodiment of the invention addressing history can be established for the memory in terms of recorded exposure of the memory cells to fatigue and imprint-inducing factors and/or acquiring dynamic charge response information from one or more reference cells or pairs of reference cells and/or one or more memory cells or pairs of memory cells in the matrix, and establishing the predetermined detection criteria and/or the acquired charge response information in order to adjust the characteristics of the voltage pulse or pulses, and the addressing history may then include the accumulated number of read and/or write cycles and/or imprinting time in specific memory cells or groups of specific memory cells, or dynamic charge response information can include information about previously recorded charge response behaviour of the memory cells. The charge response information can be acquired from at least one pair of reference cells in the matrix, one cell in each pair representing a logic 0 and the other a logic 1.

In a the method according to the invention that the control circuit device can perform continuous or periodic analysis of random and systematic noise contributions to the recorded dynamic charge response from the reference cells or addressed memory cells, employing the results from the analysis as input data into the algorithm for controlling the read/write protocol. The analysis of noise contributions can be based upon a statistical spread of dynamic charge responses recorded from cells in known logic states, from single cells being addressed a number of times and/or from a set of similar, but physically different memory cells.

In an embodiment of the method according to the invention wherein the control criteria are based on dynamic charge response information, at least one of the voltage pulse or pulses can be a step voltage pulse of variable length, the length being controlled by the circuit control device and/or that the control circuit device records the plateau values $\sigma_{BACKGROUND}$ of the charge responses in cells representing a logic "0" and a logic "1", respectively, at various points in time throughout the lifetime of the memory device, and/or that the control circuit device generates a threshold value for decision on logic state in the memory cells in said matrix, of magnitude $\sigma_{TH} = (\sigma_{USATURATION} + \sigma_{BACKGROUND})/2$, and in another embodiment that the control circuit device employs charge response information from a group of memory cells selected at randomly chosen locations in the memory array.

The features of the present invention can also be achieved with an apparatus which according to the invention is characterized in that it comprises circuitry for recording a dynamic charge response of one or more memory cells during a write or read operation and adjusting said application of voltages to limit a degree of polarization change in the polarizable material during each read and write cycle to a defined value, and a circuit for controlling the write and read operations according to an actual instantaneous charge response, with the value ranging from greater than zero to an upper limit less than the saturation magnitude of the polarization.

In an embodiment of the apparatus according to the invention the memory array comprises reference cells with known logic states, and the reference cells can be localized in pairs, one representing a logic "0" and the other a logic "1", or that the reference cells are distributed throughout the array.

In both cases according to the invention the selected cells, among said reference cells, can be assigned to track the fatigue and imprint development of specified groups of memory cells in said array, by being exposed to the same pattern of polarization history and switching events, and then the groups of memory cells can be localized on one or more word or bit lines in the array.

BRIEF DESCRIPTION OF THE SEVERAL VIEWS OF THE DRAWINGS

The present invention will become more fully understood from the detailed description given herein and the accompanying drawings, which are given by way of illustration only, and thus are not limitative of the present invention, and wherein:

FIG. 1a shows a general polarization hysteresis curve for a ferroelectric material, FIG. 1b schematically memory cells connected to word and bit lines in a passive matrix configuration, FIGS. 2a and 2b the step response time evolution at low and high temporal resolution, respectively, of the polarization in test cells containing ferroelectric materials in pristine and in fatigued states, and FIG. 3 a schematic example of a circuit for reading of data from memory cells according to the present invention.

DETAILED DESCRIPTION OF THE INVENTION

In order to facilitate a better understanding of the present invention follows below a brief description of the general background and the general physical principles involved in the realization of the invention, before specific examples of embodiments thereof are given.

Figure 1A:
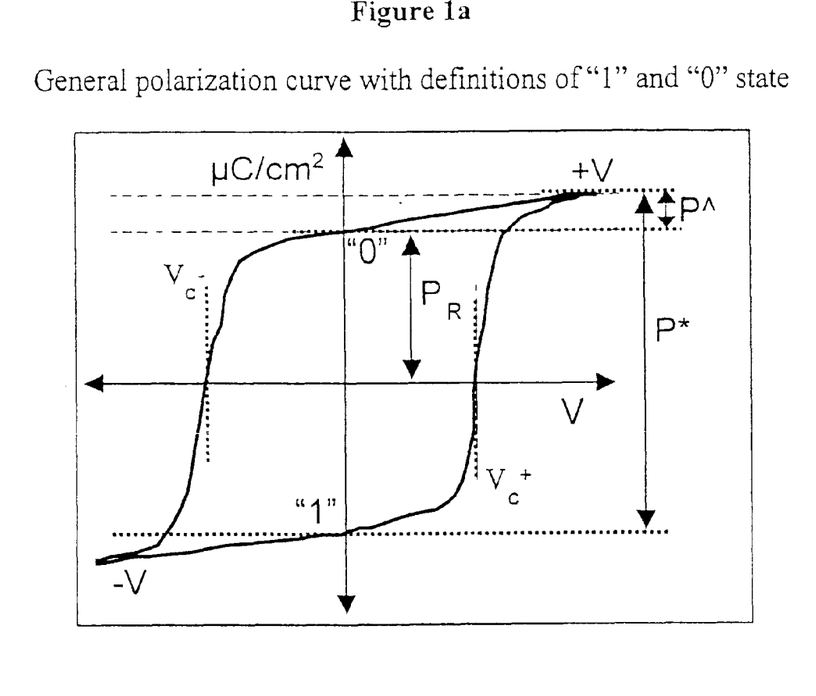
Figure 1B:
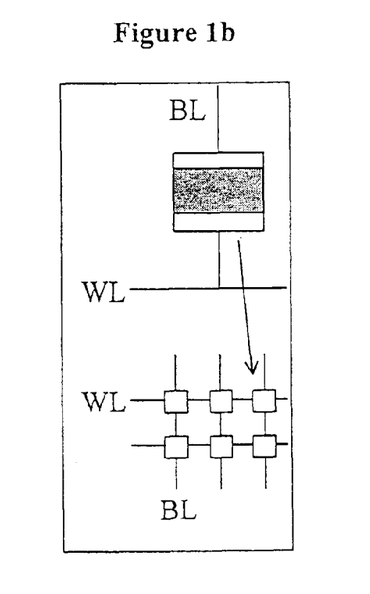

FIG. 1a shows a general polarization curve defining the polarization response of a ferroelectric memory cell, i.e. its logic "0" or logic "1" state, and provides the background for the following discussion thereof.

With reference to FIG. 1a, it is assumed that the memory cell to be read resides initially in a quiescent state without an imposed electric field and that the ferroelectric material in the cell is in a polarization state characterized by either position $+P_R$ or $-P_R$ along the polarization axis, depending on the logic state assigned to the cell. According to prior art, a reading operation to ascertain which of these states the cell is in shall involve the application of a reading pulse across the cell with a voltage $+V_{SWITCH}$. The latter voltage exceeds $V_c$, the voltage corresponding to the coercive field in the memory material, by a margin which is sufficient to drive the memory material into the saturation regime, i.e. into the region of the hysteresis curve that is closed and nearly linear. If the cell previously resided in the $+P_R$ state, only a small charge flows to/from the cell, leaving the cell in the $+P_R$ state as before. In FIG. 1a, this small charge flow is indicated by the quantity P^. However, if the cell was initially residing in the $-P_R$ state, the polarization shall undergo a reversal with attendant significant charge transfer between the cell and the electrodes. In FIG. 1a, this charge flow is indicated by the quantity P*. Thus, by monitoring the amount of charge transferred, the logic state of the cell is determined. Since this procedure destroys the memory content of the cell, a separate pulse cycle must be imposed on the same or another selected cell in the memory device, whereby the logic state of that cell is set to the original (pre-read) value of the cell that was read.

Although the present invention has general applicability to all electrically polarizable materials that exhibit hysteresis or remanence, the following discussion shall for explicitness and simplicity refer to ferroelectric materials employed in passive matrix addressing architectures.

According to the present invention, the current flow to a given memory cell is controlled in such a way that the polarization change during a read operation is less than the saturation polarization magnitude, but sufficient for a decision to be made about the logic state of the cell. Typically, a step voltage is applied to the memory cell in question, and the polarization response in the cell is monitored via the current transport to that cell. The voltage is turned off when either:

a) A certain charge accumulation time has elapsed, or b) A certain accumulated charge has been detected.

This shall typically occur at a point in time where only a fraction of the switchable polarization has been switched. In this way, several advantages are realized:

The ferroelectric material undergoes only partial polarization reversal, leading to less fatigue.

Since each reading event is only partially destructive, a given cell may sustain several reads before restoration of data becomes necessary.

An early decision can be made regarding logic state, speeding up the reading process.

Restoration of polarization loss due to read operations ("write-back") requires much less charge transfer per bit read, regardless of whether restoration is made after each read or after several reads.

A crucial element in the scheme described here is the correct choice of charge accumulation time in the reading mode. For a given cell, this time shall typically increase as the cell becomes fatigued, and it becomes necessary to adjust the read pulsing protocol accordingly. Either a predictive or a monitoring mode of defining the accumulation time may be used.

In the former, the accumulation time is adjusted according to a program that predicts the degree of fatigue from data on recorded use of the device. This must include error margins to take into account all important parameters that affect fatigue development, e.g. the temperature history, as well as cell-to-cell and device-to-device manufacturing tolerances.

In the latter, the evolution of the cell response (switching speed) is monitored throughout the lifetime of the device, and the results are used to adjust the pulsing protocol, in particular the charge accumulation time. In a preferred embodiment of the present invention, a self-diagnostic scheme is included where the condition and time evolution of the memory cells are monitored continuously by reference cells that are subjected to environmental and operational conditions that match closely those of the memory cells themselves.

In the foregoing discussion of the prior art of the invention, it was assumed that the charge transfer is near complete within each read or write cycle, and the dynamic aspect of the read/write process was ignored. However, depending on the ferroelectric material involved, the speed of polarization reversal may vary within wide limits, with inorganic ferroelectrics typically switching several orders of magnitude faster than the organic or polymer types. Prior art has been to a large extent centered on inorganic ferroelectrics, with primary emphasis on the total switching time, whereas the details of the switching transient have received little or no attention in connection with possible exploitation in read/write operations. With the advent of memory devices incorporating organic and polymeric ferroelectrics which typically switch much slower than their inorganic counterparts, the dynamic behaviour becomes an important factor affecting the overall device speed. At the same time, the slower switching provides opportunities for novel read/write schemes, since the time scales are longer and it is easier to intervene during the transient phase.

Figure 2A:
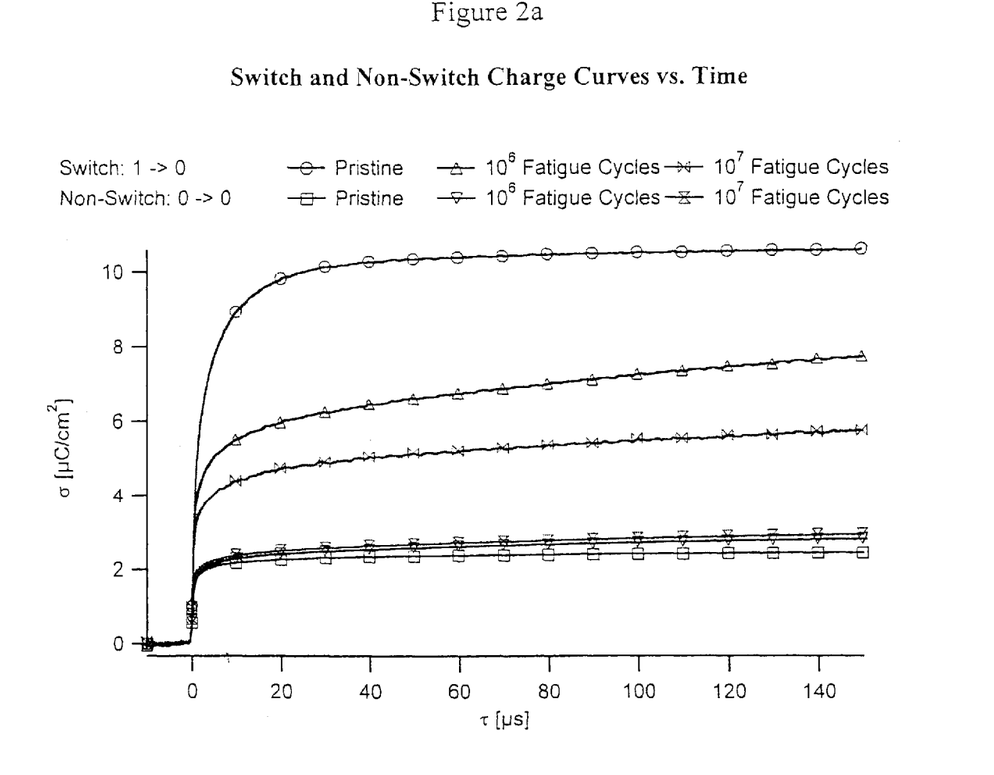
Figure 2B:
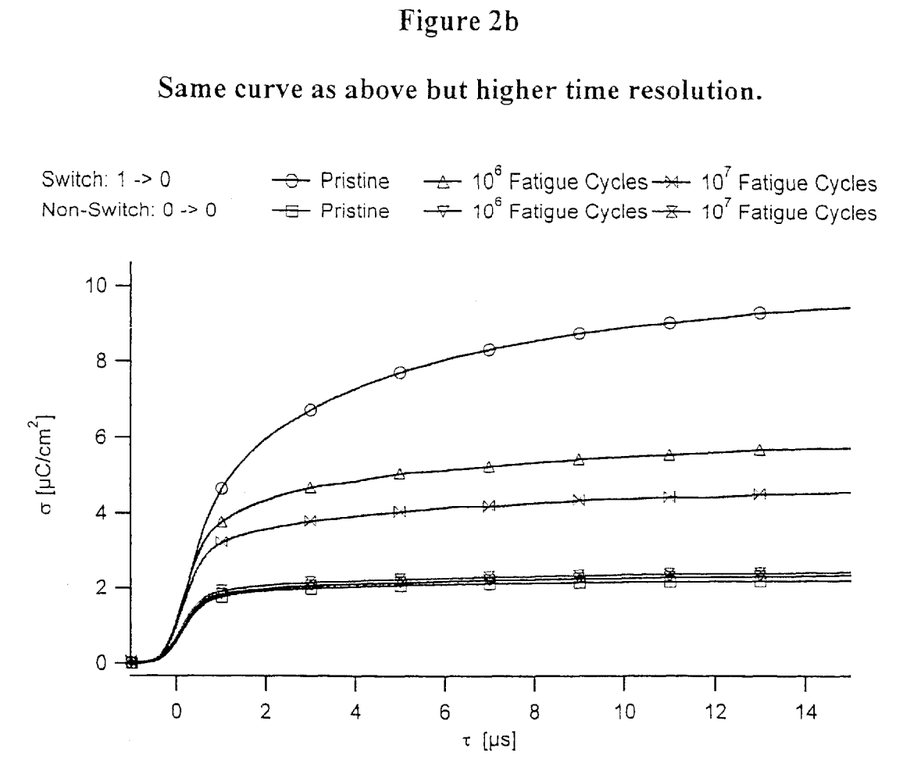

In FIGS. 2a and 2b are shown the dynamic responses for memory cells containing a polymeric ferroelectric. The cells were subjected to a step voltage $V_s$=20 V, and the time evolution was recorded for the cumulative charge density σ, i.e. charge transferred per unit area of interface between ferroelectric and electrodes, after initiation of the step pulse. Two sets of curves are shown. In the first set, encompassing the upper three curves in each figure, the cell is switched from a logic state "1" to a logic state "0", undergoing polarization reversal with large transfer of charge. In the second set, encompassing the closely grouped lower three curves in each figure, the cell already resided in a logic state "0" prior to the application of the step voltage, and only a small dielectric displacement charge response was observed. Each set of curves comprised cells that were either in a pristine state, i.e. without fatigue, or had been fatigued through $10^6$ or $10^7$ read/refresh cycles involving complete polarization reversal in each cycle.

As can be seen, there is an initial current surge followed by an asymptotic fall-off in current towards zero, i.e. the charge density σ increases rapidly from zero and reaches a plateau. The transient is much more rapid in the non-switching case (i.e. logic state "0"→"0") than in the switching case (i.e. logic state "1"→"0"), and the asymptotic values for charge density σ are lower in the former case ($\sigma_{BACKGROUND}$) than in the latter ($\sigma_{SATURATION}$). Fatigue manifests itself as a lower plateau value $\sigma_{SATURATION}$ (i.e. lower $P_R$) and a slower transient, and is clearly most prominent in the switching case. The time to reach 50% of maximum polarization in a new cell is ~1 μs, but it can take 100 μs for a fatigued cell.

According to the present invention, reading of data is performed by applying a voltage pulse, typically a voltage step, and detecting whether or not the charge density σ exceeds a certain defined threshold at some point in time after the pulse was initiated. This threshold shall not be reached, even after a long delay, if the cell is initially in a "0" logic state, but shall be exceeded if the cell is initially in a "1" logic state. In the latter case, the read pulse voltage across the memory cell is removed as soon as this level is reached.

This can be illustrated by the following example. Assume that the device in question contains individual memory cells with characteristics as shown in FIGS. 2a and 2b. As can be seen, for a cell in the "0" state, the accumulated transferred charge rises rapidly (in less than 0.5 $\mu$s) to approx. $\sigma_{BACKGROUND}$=2 $\mu$C/cm$^2$, from which point and onwards it stays virtually unchanged. For a cell in the "1" state, however, the accumulated transferred charge continues to rise rapidly after this point, reaching approx. $\sigma_{SATURATION}$= 10 $\mu$C/cm$^2$ after approximately 20 $\mu$s in the case of a new cell. For a fatigued cell, the rise is less rapid and the final value lower, but the difference from a cell in the "0" state is clear.

As a discrimination criterion, one may prescribe that a cell shall be defined as being in a "1" state if $\sigma$ at some time $\tau_{TH}$ after initiation of the read pulse exceeds a certain threshold, e.g. $\sigma > \sigma_{TH}$=5 $\mu$C/cm$^2$. This threshold should be chosen to be well above the maximum value reached by cells initially in the "0" state, in this case $\sigma_{BACKGROUND}$=2 $\mu$C/cm$^2$. From FIGS. 2a and 2b one observes that the charge accumulation time $\tau_{TH}$ to reach $\sigma_{TH}$ from a "1" state shall be approx. 1 $\mu$s for the pristine cell, 5 $\mu$s for the cell fatigued 10$^6$ times and 40 $\mu$s for the 10$^7$ cycles fatigued cell. According to prior art which relies on complete switching and a fixed charge accumulation time, the latter would have to be defined sufficiently long to permit completion of the switching transient in the worst case, i.e. with fatigued cells. Thus, the read pulse would have to be chosen in the range 50-100 $\mu$s rather than 1 $\mu$s. According to the present invention, however, the read-out pulse is stopped when the accumulated charge density reaches the threshold value $\sigma_{TH}$, and the logic state "1" is assigned to the cell. If this threshold is not reached during a certain defined time span $\tau >> \tau_{TH}$, the cell in question is in a logic state "0".

The above scheme implies that the read pulse is lengthened automatically as the response of the cell is slowed down due to fatigue, always being kept as short as possible and consistent with the defined threshold criterion. This provides the following advantages:

Firstly, there is a gain in reading speed over the prior art full switching scheme.

Secondly, if data are written back to the same cell, less polarization reversal is involved, and the write-back cycles can be shortened commensurately with the read cycle case. Imprint effects (i.e. the tendency for the ferroelectric material in the cell to lock into a logic state where it has resided for some time) may shorten the write-back time further, depending on materials and operating conditions.

Thirdly, since the polarization switching and electric field exposure is minimized, fatigue shall generally progress much more slowly than in the full switching scheme. Tests on device relevant polymeric ferroelectrics demonstrated that dynamic readout according to the present invention increased the fatigue resistance (i.e. the number of read/write-back cycles with acceptable confidence level) by several orders of magnitude compared to prior art switching protocols employing full polarization reversal.

Fourthly, multiple read cycles between each write-back cycle are possible when $\sigma_{SATURATION} >> \sigma_{BACKGROUND}$.

Now a preferred embodiment, namely self-diagnostic determination of memory cell response shall be discussed in more detail. As described above, the charge accumulation time must be increased as the cells fatigue. Ideally, each cell in the memory device should be read with a read pulse length optimally adjusted for that cell. This is difficult, since the response characteristics shall vary from cell to cell due to manufacturing tolerances and fatigue/imprint history. The latter in particular may lead to very large cell-to-cell variations developing over time, since fatigue and imprint not only relates to the number of read/write cycles experienced by the individual cells, but also to the combined effect of voltage stress (amplitude/polarity/duration) and other factors such as temperatures experienced by the cell during its lifetime.

As a consequence, a predictive approach to read pulse adjustment shall generally be relatively coarse, allowing for a spread in cell properties which increases with time and use. Alternatively, one must allocate significant resources in the device that are dedicated to keep track of the cumulative fatigue on cells. This task may be simplified by protocols that distribute wear among the total number of memory cells in the device in such a way that cells with comparable fatigue history can be identified in groups or blocks.

Figure 3:
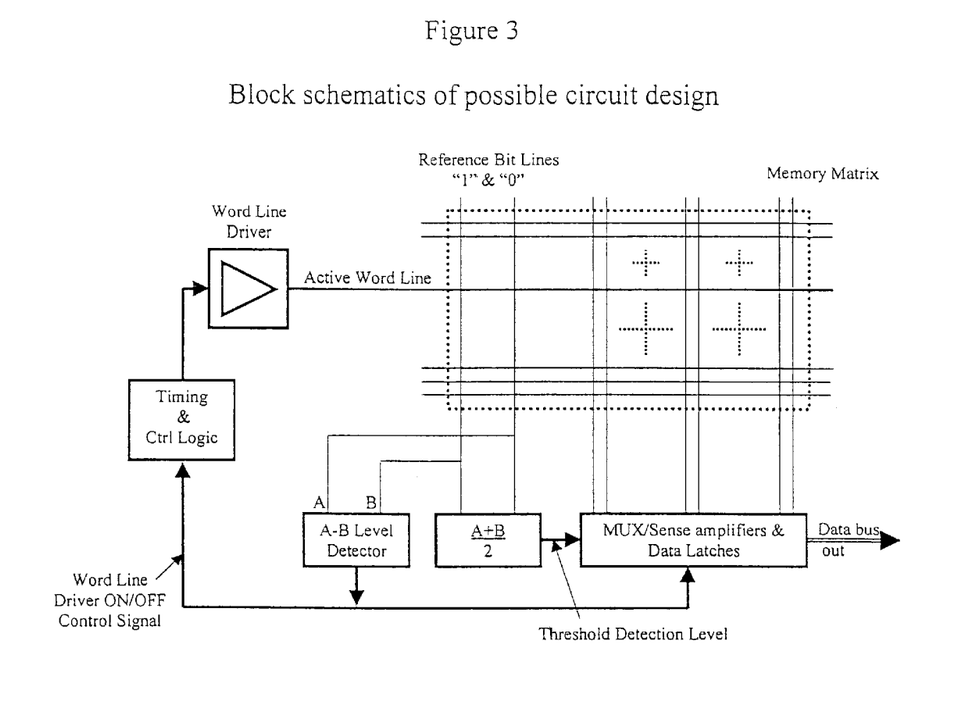

A monitoring, or self-diagnostic approach shall in most cases be preferable. The basic principle can be exemplified as follows, with reference to FIG. 3. For each row or cluster of memory cells one uses two reference cells, one polarized in the "1" state and the other in the "0" state. These two cells are exposed to fatigue-inducing influences, in particular polarization switching, which are representative of the row or cluster of memory cells they are assigned to. Two modes of read operations employing the reference cells shall be specifically mentioned here:

i) Throughout the operative lifetime of the memory device, the reference cells are used to track the development of $\sigma_{SATURATION}$ and $\sigma_{BACKGROUND}$, from which the threshold value $\sigma_{TH}$ is defined, stored and updated. In addition, the relevant charge accumulation time $\tau_{TH}$ to reach $\sigma_{TH}$ for cells in one of the above-mentioned states is established. During the readout cycle signals from the memory cells are compared with the threshold level $\sigma_{TH}$ at time $\tau_{TH}$, and the logic state of the cell is determined. In one class of embodiments under this scheme, the median value is used as a threshold level, i.e. $\sigma_{TH}=(\sigma_{SATURATION}+\sigma_{BACKGROUND})/2$.

Since this mode implies driving the reference cells to saturation, they shall typically be sampled periodically, either in a separate sample cycle or in a read cycle involving an extended read pulse.

ii) During each read operation, both the "0" and the "1" reference cells are subjected to a reading pulse, and the respective charge densities $\sigma_0(\tau)$ and $\sigma_1(\tau)$ transferred to each are monitored as a function of the time $\tau$ elapsed after initiation of the read pulse. As can be seen from FIG. 2, the difference $(\sigma_0(\tau)-\sigma_1(\tau))$ between the two increases with time, starting at zero and ultimately reaching a value $(\sigma_{SATURATION}-\sigma_{BACKGROUND})$. At some time $\tau_{TH}$ this difference has reached a certain level where it can be reliably detected in the presence of noise and cell-to-cell variability, at which time the read pulse is terminated and the sense amplifiers of the row or the cluster of memory cells that are associated with these reference cells are read. The recorded values $\sigma_0(\tau_{TH})$ and $\sigma_1(\tau_{TH})$ are available at this point as input parameters for the logic state determination process.

In both cases i) and ii) above, the read pulse length $\tau_{TH}$ increases automatically as the cells fatigue, at the same time being kept as short as is consistent with certain pre-defined detection and discrimination criteria. The latter may be selected to meet different confidence levels according to the intended use of the device.

Cases i) and ii) provide different advantages and drawbacks which can be stated as follows.

Case i)

Advantage: Direct information is obtained about the development of the parameters $\sigma_{SATURATION}$ and $\sigma_{BACKGROUND}$.

Drawback: A separate pulse cycle is required.

Case ii)

Advantage: Can be implemented without separate pulse cycle (but the reference cells must be in the correct logic states at the initiation of the read cycle) and imposes representative pulsing fatigue on the reference cells.

Drawback: Requires circuitry capable of generating thresholding/discrimination parameters in real time. In "single shot" usage, i.e. when the data in the cluster or row of cells in question are read only once or at long intervals, the discrimination parameters derived in this mode shall reflect the full noise in the captured single sampling event.

The physical implementation of readout circuitry employing reference cells may be achieved in many ways obvious to a skilled person. An apparatus comprising a matrix-addressable array of memory cells and capable of performing write and read operations thereto in accordance with the method of the invention is shown in FIG. 3. It should be understood that the apparatus in FIG. 3 is although prima facie rendered as a passive matrix-addressable array is not limited thereto, but that the matrix-addressable array of memory cells might just as well be biased on active matrix-addressing, i.e. provided with memory cells including a switching transistor. The basic scheme shown in FIG. 3 may be used in conjunction with both types of operation modes i) and ii) discussed above. Here, reference cells are located on two dedicated vertical addressing lines ("bit lines"), one with "0" cells and the other with "1" cells. In a reading cycle, a horizontal line ("word line") at a time is subjected to a reading pulse, and the charge flowing to the cells at the crossing points between the addressed horizontal line and the crossing vertical lines is monitored by circuitry shown at the bottom of the matrix. Thus, the memory cells on each given horizontal line have associated with them a reference cell pair on that same line.

More bit lines with reference cells may, of course, be added at intervals throughout the whole memory matrix. In certain cases it may be advantageous to employ single "1" or "0" reference bit lines rather than pairs, or reference cells may occupy less than the whole length of a bit line, even down to a single cell. The latter shall be the case when reference cells are located along word lines rather than bit lines, which is a variant of the present invention.

The diagram as shown in FIG. 3 indicates hard wiring between the reference bit lines and the reference signal detectors. However, by multiplexing and signal routing, reference bit lines may be defined at any location in the matrix. Thus, it shall in many cases be advantageous to establish reference cells in regions of the memory matrix that have been subjected to fatigue and imprint during the regular use of the memory device, with the possibility of moving from location to location in the matrix throughout the lifetime of the memory device. In this way, realistic data shall always be available for the readout decision process.

For simplicity, circuitry for writing data to the cells in the matrix is not shown in FIG. 3. Write back to preserve the destructively read data may be done immediately after the read cycle with a pulse of approximately the same length as determined in the read cycle, or it may be postponed until the polarization level in the cell has reached a lower value as a consequence of multiple reads. In the latter case, a longer write back pulse shall be required.

In order to obtain reliable reference data, the number of reference cells in the memory device should evidently be sufficiently large to permit close mimicry of the usage pattern of the actual memory cells in question, with small statistical spread. However, a large allocation of real estate and dedicated circuitry to reference cells shall compete with the other memory and processing functions in the device, and in practice a limited number of reference cells shall be associated with a much larger number of memory cells, which may be in close physical proximity to the reference cells (e.g. in a cluster), or may be linked to a set of memory cells that experience mutually similar kind of reading and writing exposure. The latter may be, e.g. a given sector in the memory device comprising cells not necessarily in mutual physical proximity, or a row of cells in an addressing matrix where the whole row is read at a time.

Many variations of the present invention are obvious to one of ordinary skill in the art and the discussion herein is intended to encompass in scope such obvious variations of the present invention.

We claim.

1. A method for performing write and read operations in a matrix-addressed memory array of memory cells comprising:

providing an electrically polarizable material exhibiting polarization remanence, wherein a logical value stored in a memory cell is represented by an actual polarization state in the memory cell and determined by detecting a charge flow to or from said memory cell in response to the application of voltages to word lines and bit lines for addressing the memory cells of the array, wherein the charge flow detection is based on detecting a charge flow component caused by a change of polarization in said polarizable material; and performing write and read operations under control of a control circuit device by using said control circuit device to control the read and write voltages of the memory cells using dynamic charge response information from chosen memory cells by, recording a dynamic charge response of one or more of the memory cells during a write or read operation, by limiting a degree of polarization in the polarizable material during each write and read cycle to a value dependent on the recorded dynamic charge response of the chosen memory cells, and controlling the write and read operations according to an actual instantaneous charge response information with said value ranging from zero to an upper limit equal to the saturation magnitude of the polarization and consistent with predetermined criteria for a reliable detection of a logic state of a memory cell.

2. A method according to claim 1, wherein the stored logical value of a memory cell is determined by application of one or more voltage pulses, the characteristics of which are controlled by said control circuit device.

3. A method for performing write and read operations in a matrix-addressed memory array of memory cells comprising:

providing an electrically polarizable material exhibiting polarization remanence, wherein a logical value stored in a memory cell is represented by an actual polarization state in the memory cell and determined by detecting a charge flow to or from said memory cell in response to the application of voltages to word lines and bit lines for addressing the memory cells of the array, wherein the charge flow detection is based on detecting a charge flow component caused by a change of polarization in said polarizable material; and performing write and read operations under control of a control circuit device, where said control circuit device controls the read and write voltages of the memory cells using dynamic charge response information from chosen memory cells, where the control circuit limits the degree of polarization in the polarizable material during each write and read cycle to a value dependent on the recorded dynamic charge response of the chosen memory cells, and controlling the write and read operations according to an actual instantaneous charge response information with said value ranging from zero to an upper limit equal to the saturation magnitude of the polarization and being consistent with predetermined criteria for a reliable detection of a logic state of a memory cell, further having an addressing history for the memory in terms of recorded exposure of the memory cells to fatigue and imprint-inducing factors and/or acquiring the dynamic charge response information from one or more reference cells or pairs of reference cells and/or one or more memory cells or pairs of memory cells in the matrix, and establishing the predetermined detection criteria and/or the acquired dynamic charge response information as basis for control criteria in order to adjust the characteristics of the voltage pulse or pulses.

4. A method according to claim 3, wherein the addressing history includes an accumulated number of write and/or read cycles and/or imprinting time in specific memory cells or groups of specific memory cells.

5. A method according to claim 3, further comprising:

including, in the dynamic charge response information, data about previously recorded charge response behavior of the memory cells.

6. A method according to claim 3, further comprising:

acquiring the dynamic charge response information by recording the dynamic charge response of least one pair of reference cells in the matrix, one cell of each pair representing a logic 0 and the other a logic 1.

7. A method according to claim 5 or 6, wherein the control circuit device performs continuous or periodic analysis of random and systematic noise contributions to the recorded dynamic charge response from said reference cells or addressed memory cells, and employing the results of the analysis as input data of an algorithm for controlling a read/write protocol.

8. A method according to claim 7, further comprising:

basing said analysis of noise contributions upon a statistical spread of dynamic charge responses recorded from memory cells in known logic states, from single memory cells being addressed a number of times, and/or from a set of similar, but physically different memory cells.

9. A method according to claim 3, wherein the control criteria are based on dynamic charge response information, and wherein at least one of said voltage pulse or pulses is a step voltage pulse of variable length, the length being controlled by said circuit control device.

10. A method according to claim 3, wherein the control criteria are based on dynamic charge response information, said method further comprising using said control circuit device to record plateau values $\sigma_{SATURATION}$ and $\sigma_{BACKGROUND}$ of the charge responses in cells representing a logic "0" and a logic "1", respectively, at various points in time throughout the lifetime of the memory device.

11. A method according to claim 3, wherein the control criteria are based on dynamic charge response information, said method further comprising using said control circuit device to generate a threshold value for decision on logic states in said memory cells in said matrix, of magnitude $\sigma_{TH} = (\sigma_{SATURATION} + \sigma_{BACKGROUND})/2$.

12. A method according to claim 3, said control circuit device employ dynamic charge response information acquired from recording the dynamic charge response of a group of memory cells selected at randomly chosen locations in the memory array.

13. Apparatus for performing write and read operations, said apparatus including:

at least one matrix-addressed array of memory cells of an electrically polarizable material exhibiting polarization remanence, wherein a logical value stored in a memory cell is represented by the polarization state in individual, separately selectable memory cells, and determined by detecting a charge flow to or from said memory cells in response to an application of voltages to the word and bit lines for addressing the memory cells of an array, the charge flow detection being based on a charge flow component caused by a change of polarization in said polarizable material; and circuitry for recording a dynamic charge response of one or more memory cells during a write or read operation and using the dynamic charge response to adjust the application of voltages to limit a degree of polarization change in said polarizable material during each read and write cycle to a defined value, and controlling said write and read operations, according to an actual instantaneous charge response, with the value ranging from zero to an upper limit equal to the saturation magnitude of the polarization.

14. Apparatus for performing write and read operations, said apparatus including:

at least one matrix-addressed array of memory cells of an electrically polarizable material exhibiting polarization remanence, wherein a logical value stored in a memory cell is represented by the polarization state in individual, separately selectable memory cells, and determined by detecting a charge flow to or from said memory cells in response to an application of voltages to the word and bit lines for addressing the memory cells of an array, the charge flow detection being based on a charge flow component caused by a change of polarization in said polarizable material; and circuitry for recording a dynamic charge response of one or more memory cells during a write or read operation and adjusting said application of voltages to limit a degree of polarization change in said polarizable material during each read and write cycle to a defined value, and a circuit for controlling said write and read operations, according to an actual instantaneous charge response, with the value ranging from zero to the saturation magnitude of the polarization, wherein said memory array comprises reference cells with known logic states.

15. Apparatus according to claim 14, wherein said reference cells are localized in pairs, one representing a logic "0" and the other a logic "1".

16. Apparatus according to claim 14, wherein said reference cells are distributed throughout said array.

17. Apparatus according to claim 15 or claim 16, wherein selected cells among said reference cells are assigned to track the fatigue and imprint development of specified groups of memory cells in said array, by being exposed to a similar pattern of polarization history and switching events as the latter.

18. Apparatus according to claim 17, wherein groups of memory cells are localized on one or more word or bit lines in said array.

19. A method for performing read operations in a matrix-addressed memory array of memory cells comprising:

providing an electrically polarizable material exhibiting polarization remanence, wherein a logical value stored in a memory cell is represented by an actual polarization state in the memory cell and determined by detecting a charge flow to or from said memory cell in response to the application of voltages to word lines and bit lines for addressing the memory cells of the array, wherein the charge flow detection is based on detecting a charge flow component caused by a change of polarization in said polarizable material; and reading under control of a control circuit device, where said control circuit device controls the read voltages of the memory cells using dynamic charge response information from chosen memory cells, the control circuit limiting the degree of polarization in the polarizable material during each read cycle to a value dependent on the recorded dynamic charge response of the chosen memory cells, and controlling the read operations according to an actual instantaneous charge response information with said value ranging from zero to an upper limit equal to the saturation magnitude of the polarization and being consistent with predetermined criteria for a reliable detection of a logic state of a memory cell.

20. Apparatus for performing read operations, said apparatus including:

at least one matrix-addressed array of memory cells of an electrically polarizable material exhibiting polarization remanence, wherein a logical value stored in a memory cell is represented by the polarization state in individual, separately selectable memory cells, and determined by detecting a charge flow to or from said memory cells in response to an application of voltages to the word and bit lines for addressing the memory cells of an array, the charge flow detection being based on a charge flow component caused by a change of polarization in said polarizable material; and circuitry for recording a dynamic charge response of one or more memory cells during a read operation and using the dynamic charge response to adjust the application of voltages to limit a degree of polarization change in said polarizable material during each read cycle to a defined value, and a circuit for controlling said read operations, according to an actual instantaneous charge response, with the value ranging from zero to an upper limit equal to the saturation magnitude of the polarization.

21. The apparatus according to claim 1, wherein the polarizable material is an electret or ferroelectric material.

22. The apparatus according to claim 1, wherein the control circuit device is characterized by recording a dynamic change response of one or more of the memory cells during a write or read operation.

23. The apparatus of claim 9 wherein the polarizable material is a ferroelectric material.

* * * * *